United States Patent
Duvvury et al.

(10) Patent No.: US 6,667,865 B2
(45) Date of Patent: Dec. 23, 2003

(54) EFFICIENT DESIGN OF SUBSTRATE TRIGGERED ESD PROTECTION CIRCUITS

(75) Inventors: Charvaka Duvvury, Plano, TX (US); Sridhar Ramaswamy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 265 days.

(21) Appl. No.: 09/864,506

(22) Filed: May 24, 2001

(65) Prior Publication Data

US 2002/0030954 A1 Mar. 14, 2002

Related U.S. Application Data

(60) Provisional application No. 60/231,660, filed on Sep. 11, 2000.

(51) Int. Cl.[7] ................................................. H02H 9/00
(52) U.S. Cl. ........................................................ 361/56
(58) Field of Search ............................. 361/56, 91, 111

(56) References Cited

U.S. PATENT DOCUMENTS

| | | | |
|---|---|---|---|
| 5,530,612 A | * 6/1996 | Maloney | 361/56 |
| 5,903,419 A | * 5/1999 | Smith | 361/56 |
| 5,907,462 A | 5/1999 | Chatterjee et al. | |
| 5,926,353 A | * 7/1999 | Misek | 361/56 |
| 5,940,258 A | 8/1999 | Duvvury | |
| 6,046,897 A | * 4/2000 | Smith et al. | 361/111 |
| 6,509,585 B2 | * 1/2003 | Huang | 257/173 |

* cited by examiner

*Primary Examiner*—Adolf D. Berhane
(74) *Attorney, Agent, or Firm*—Peter K. McLarty; W. James Brady, III; Frederick J. Telecky, Jr.

(57) ABSTRACT

A semiconductor device is designed with a common supply voltage terminal (330). A plurality of standard cells (360–364), each having a plurality of leads (308,326) is connected to the common supply terminal. A plurality of connecting leads (322–324) corresponding to respective standard cells is coupled between at least two leads of the plurality of leads.

15 Claims, 5 Drawing Sheets

EFFICIENT DESIGN OF SUBSTRATE TRIGGERED ESD PROTECTION CIRCUITS

This application claims priority under 35 USC §119(e)(1) of provisional application No. 60/231,660, filed on Sep. 11, 2000.

FIELD OF THE INVENTION

This invention relates to an integrated circuit and more particularly to a protection circuit for an integrated circuit with high voltage input signals and improved oxide reliability.

BACKGROUND OF THE INVENTION

Present complementary metal oxide semiconductor (CMOS) and bipolar-CMOS (BiCMOS) circuits employ electrostatic discharge protection (ESD) circuits to protect against electrostatic discharge due to ordinary human and machine handling. This electrostatic discharge occurs when the semiconductor circuit contacts an object that is charged to a substantially different electrostatic potential of typically several thousand volts. The contact produces a short-duration, high-current transient in the semiconductor circuit. This high current transient may damage the semiconductor circuit through joule heating. Furthermore, high voltage developed across internal components of the semiconductor circuit may damage MOS transistor gate oxide.

Sensitivity of the semiconductor circuit is determined by various test methods. A typical test circuit used to determine sensitivity of the semiconductor circuit to human handling includes a capacitor and resistor that emulate a human body resistor-capacitor (RC) time constant. This test circuit is frequently referred to as a human body model (HBM) test. The capacitor is preferably 100 pF, and the resistor is preferably 1500 Ω, thereby providing a 150-nanosecond time constant. A semiconductor device is connected to the test circuit at a predetermined external terminal for a selected test pin combination. In operation, the capacitor is initially charged to a predetermined stress voltage and discharged through the resistor and the semiconductor device. A post stress current-voltage measurement determines whether the semiconductor device is damaged. Although this test effectively emulates electrostatic discharge from a human body, it fails to comprehend other common forms of electrostatic discharge.

A charged-device ESD test is another common test method for testing semiconductor device sensitivity. This method is typically used to determine sensitivity of the semiconductor circuit to ESD under automated manufacturing conditions. The test circuit includes a stress voltage supply connected in series with a current limiting resistor. The semiconductor device forms a capacitor above a ground plane that is typically 1–2 pF. A low impedance conductor forms a discharge path having an RC time constant typically two orders of magnitude less than a human body model ESD tester. In operation, the semiconductor device is initially charged with respect to the ground plane to a predetermined stress voltage. The semiconductor device is then discharged at a selected terminal through the low impedance conductor. This connection produces a high-voltage, high-current discharge in which a magnitude of the initial voltage across the semiconductor device approaches that of the initial stress voltage.

A particular problem of protection circuit design arises on circuits with multiple voltage supply lines such as Vss. High current during ESD stress develops high voltage across the parasitic resistance of these voltage supply lines. These resulting high voltages vary with the ESD stress pin combination and induce complex stress current paths within the circuit. These complex current paths may cause failures in the internal circuit that are difficult to anticipate and to detect. Moreover, conventional protection schemes may be ineffective in preventing failure from these complex current paths, since they concern stress current flow in an intended protection circuit rather than in an internal circuit.

Referring to FIG. 1, there is a plot of HBM failure voltages for semiconductor device pins 1–141 with respect to Vss. The semiconductor device pins are generally arrayed around the perimeter of the semiconductor device in the order of the plot. The failure voltages are determined by application of ESD stress voltage in increasing increments for each pin combination until the semiconductor device fails. The semiconductor device includes several types of standard cells as indicated in the legend. Each type of standard cell has substantially the same physical layout, although it may be flipped or rotated in various placements around the perimeter of the semiconductor device as is well known to those of ordinary skill in the art. The standard cell types include input/output (I/O) cells (FIG. 2A), Output cells (FIG. 2B), Input 2 type cells (FIG. 2C) and Input 6 type cells (FIG. 2D). A wide variation of failure voltages for a single standard cell is evident from the plot. For 15 example, an output cell at pin 13 fails at 2000 volts at region 110. The same output cells at pins 14 and 15 in region 112 fail above 3000 volts. An output cell at pin 21, however, fails above 5000 volts. Similarly, an I/O cell at pin 67 fails at 2500 volts while the same I/O cell fails at 5000 volts at pin 79 in region 120. In each case, the failure voltage increases for pins close to a Vss pin and decreases for pins that are remote from a Vss pin. An Output cell at region 114 and adjacent to Vss pin 102 has a much higher failure voltage than pin voltages plotted at either region 110 or region 116. The same pattern applies to the I/O cell plotted at region 120 compared to I/O cells plotted at regions 118 and 122. Thus, increasing parasitic resistance of Vss supply lines significantly degrades respective failure voltages of like cells as the distance from Vss pins increases.

SUMMARY OF THE INVENTION

These problems are resolved by a semiconductor device with a common supply voltage terminal. A plurality of standard cells, each having a plurality of leads is connected to the common supply terminal. A plurality of connecting leads corresponding to respective standard cells is coupled between at least two leads of the plurality of leads.

The present invention eliminates premature semiconductor device failure due to high voltage signals.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
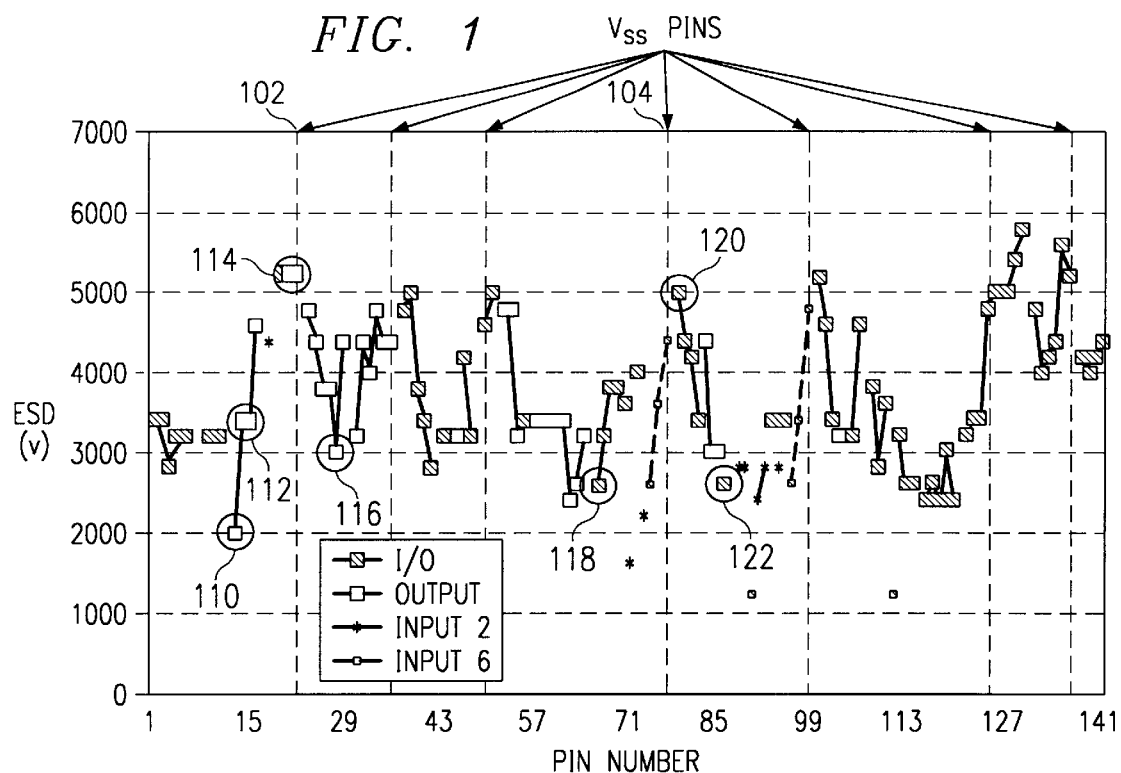
FIG. 1 is a plot of ESD failure voltage for each pin of a semiconductor device.
Figure 2A:
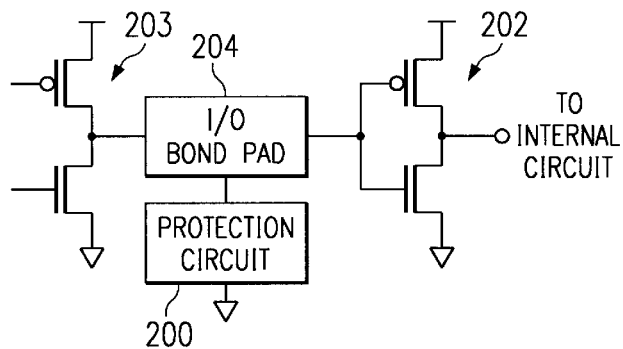
FIGS. 2A–2D are schematic diagrams of the standard cell circuits identified in the legend of FIG. 1.
Figure 2B:
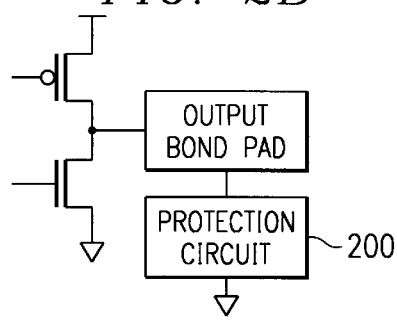
Figure 2C:
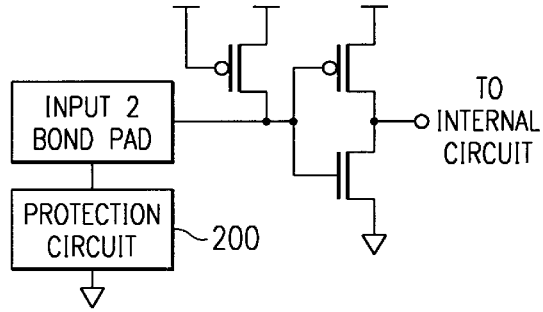
Figure 2D:
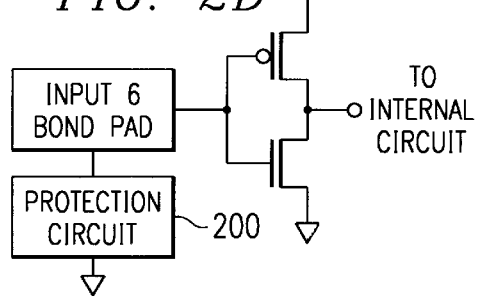
Figure 3:
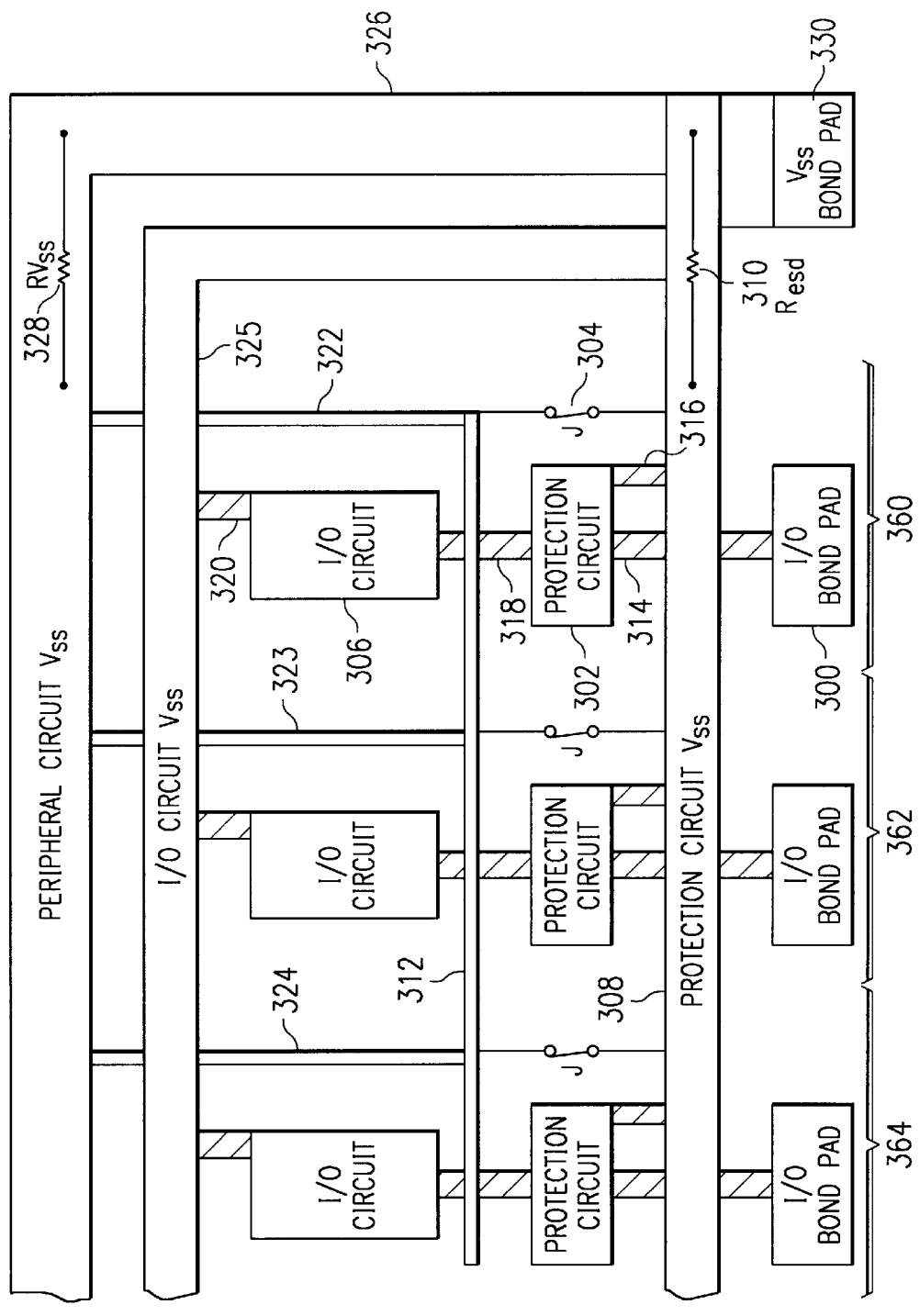
FIG. 3 is a simplified diagram showing an exemplary layout of standard cells as connected to multiple supply voltage lines Vss.

The circuit of FIG. 3 is a simplified diagram showing an exemplary layout of I/O standard cells as in FIG. 2A as connected to multiple supply voltage lines Vss. Each standard cell 360–364 is substantially the same. The following detailed discussion of standard cell 360, therefore, applies to standard cells 362 and 364 and generally to other types of standard cells as well. Standard cell 360 includes an I/O circuit 306 having an input buffer 202 and an output buffer 203 (FIG. 2A). The I/O circuit 306 (FIG. 3) is connected to protection circuit 302 and to an I/O bond pad 300 via lead 314. The I/O circuit 306 is also connected to an I/O circuit Vss lead 325. This I/O circuit Vss lead is routed separately from other Vss leads to Vss bond pad 330 to minimize noise on other Vss leads such as lead 308 and 326. The protection circuit 302 is connected to protection circuit Vss lead 308. This protection circuit lead 308 has a parasitic resistance 310 that depends on the cross section area of the lead as well as the distance from standard cell 360 to Vss bond pad 330. A peripheral circuit Vss lead 326 is routed parallel to the I/O circuit lead 326 opposite the I/O circuit 306. This peripheral circuit Vss lead 326 is preferably connected to logic circuits (not shown) within the semiconductor device and includes parasitic resistance 328.

These multiple Vss leads 308, 325 and 329 are preferably routed through many standard cells such as standard cells 360–364 at the perimeter of the semiconductor device in the same orientation with respect to each standard cell. Thus, each lead preferably passes through each standard cell even if it is not used by that standard cell. Moreover, the orientation of each of the multiple Vss leads and Vdd leads (not shown) is determined to facilitate connection of circuits that are connected to their respective leads. Another Vss lead 322 is connected between peripheral circuit Vss lead 326 and lead 312. Yet another small Vss lead including jumper 304 connects protection circuit Vss lead 308 to Vss lead 322. This jumper 304 is advantageously added to standard cells 362 and 364 to form a matrix connecting protection circuit Vss lead 308 to peripheral circuit Vss lead 326 along their respective lengths around the perimeter of the semiconductor device. This matrix connection permits formation of jumper 304 from relatively small leads, thereby conserving layout area of the standard cell. A parallel combination of plural jumpers 304 in several standard cells provides a low resistance path connecting protection circuit Vss lead 308 to peripheral circuit Vss lead 326. This connection does not compromise normal circuit operation when both leads typically carry low noise signals. During an ESD event, however, both leads are connected in parallel, so that parasitic resistors Resd 310 and RVss 328 are in parallel. Thus, the total parasitic resistance between each standard cell and a remote Vss bond pad 330 is greatly reduced without a significant layout penalty.

Figure 4:
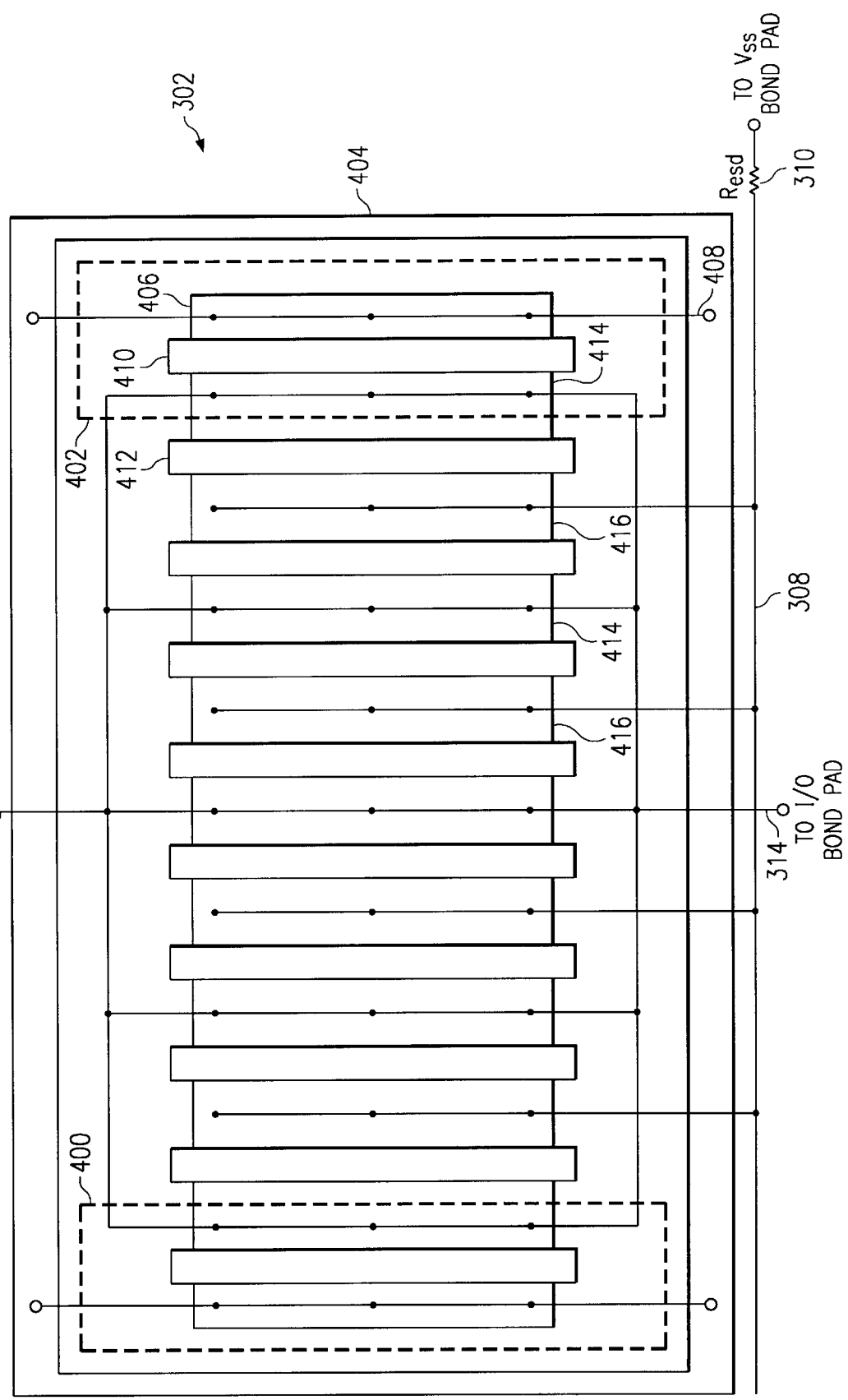
FIG. 4 is a layout diagram of an exemplary protection circuit that may be used with a standard cell of FIG. 3.

Referring now to FIG. 4, there is a layout diagram of an exemplary protection circuit that may be used with a standard cell of FIG. 3. The protection circuit includes a gate-coupled MOS transistor (GCD) having plural gate terminals 412 and having drain terminals 414 and source terminals 416. The drain terminals 414 are connected at the heavy dots or vias to an I/O bond pad via lead 314 and to an I/O circuit via lead 318. The source terminals 416 are connected at the heavy dots or vias to a Vss bond pad via lead 308. The protection circuit includes MOS pump transistors 400 and 402 indicated by dashed lines at the ends of the gate-coupled MOS transistor. Each pump transistor shares a drain 414 with the gate-coupled MOS transistor. The source 406 of each pump transistor is connected to guard ring 404 via lead 408.

Figure 5:
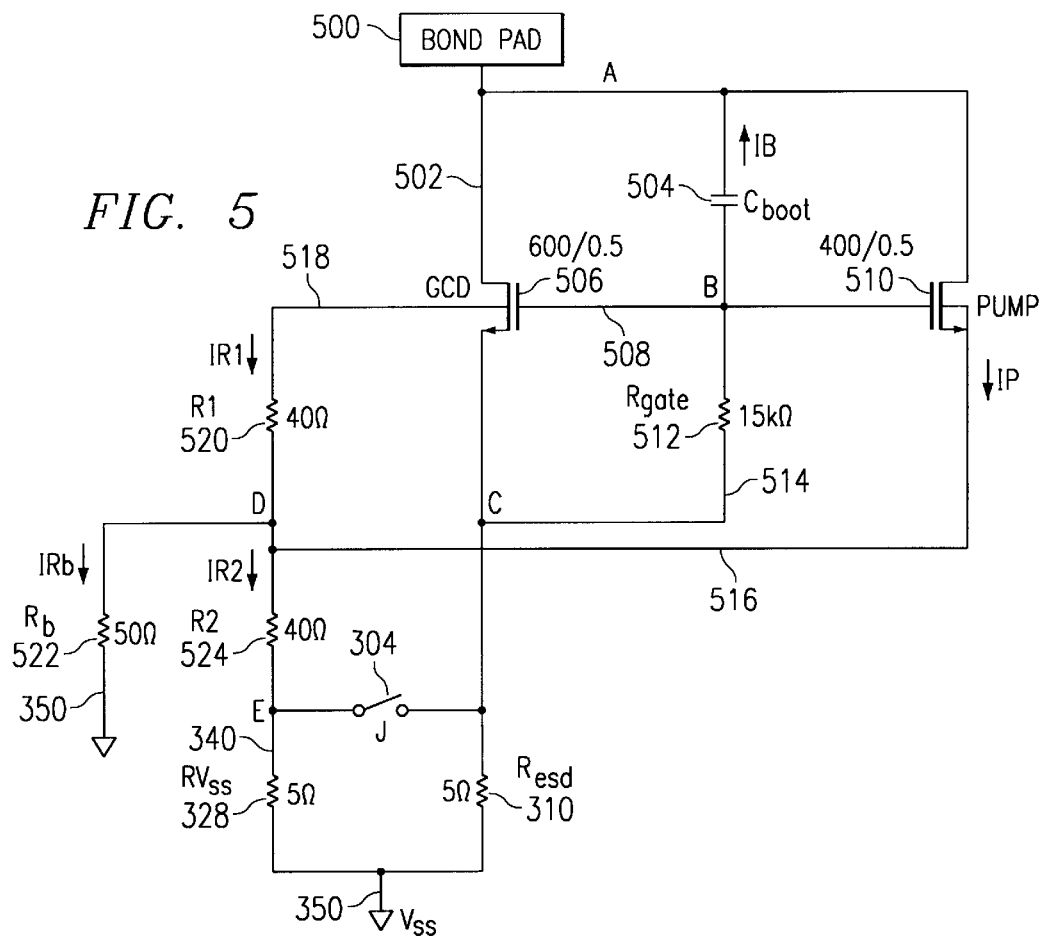
FIG. 5 is a schematic diagram of the protection circuit of FIG. 4 showing parasitic resistance values.
Figure 6:
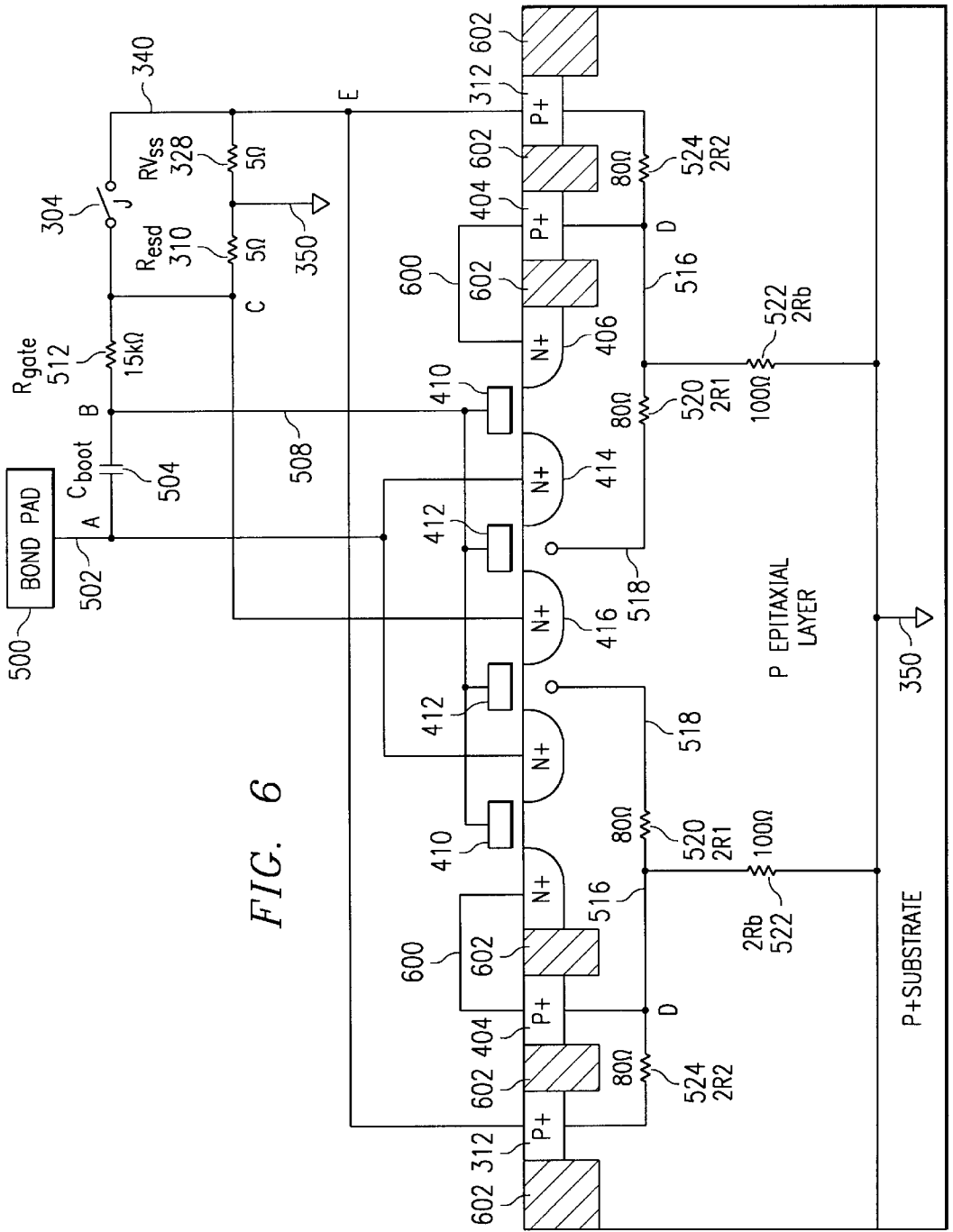
FIG. 6 is a simplified cross section diagram of the protection circuit of FIG. 4.

Referring now to FIGS. 5 and 6 the protection circuit of FIG. 4 will be explained in detail. The drain of gate-coupled transistor 506 is connected to bond pad 500 by lead 502. Parasitic resistor Resd 310 couples the source of gate-coupled transistor 506 to Vss terminal 350. The drain of pump transistor 510 is connected to bond pad 500. The source of pump transistor 510 is connected to guard ring terminal 404 at point D. For this exemplary embodiment of the protection circuit, the gate-coupled transistor 506 and the pump transistor 510 are N-channel transistors and the guard ring 404 is a P+ type guard ring. The guard ring terminal 404 is connected to Vss terminal 350 through bulk parasitic resistance Rb 522 and through bulk parasitic resistance R2 524 in series with the parasitic resistance RVss 328 of lead 326. The source of the pump transistor 510 is also connected by bulk parasitic resistance R1 to the bulk terminal 518 of the gate-coupled MOS transistor. A bootstrap capacitor Cboot 504 is connected between bond pad 500 and the common gate terminal 508 of the gate-coupled transistor and the pump transistor. This bootstrap capacitor may be a parasitic gate-to-bulk capacitance for each transistor. Alternatively, the capacitor Cboot 504 may be formed from a thin oxide MOS transistor with common source and drain terminals. A resistor Rgate 512 is connected between the common gate terminal 508 and the source of the gate-coupled transistor 506.

Figure 7:
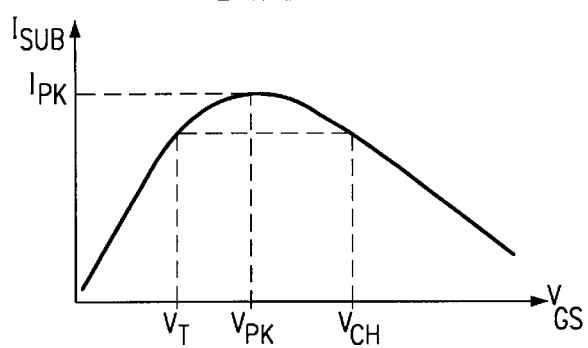
FIG. 7 is a plot of substrate current as a function of gate-to-source voltage for an MOS transistor as in the protection circuit of FIG. 4.
Figure 8:
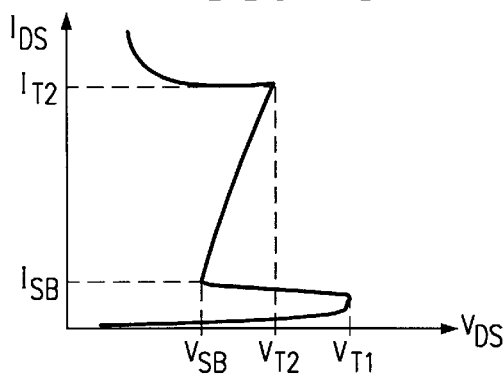
FIG. 8 is a plot of drain-to-source current as a function of drain-to-source voltage for an MOS transistor as in the protection circuit of FIG. 4.

Operation of the protection circuit of FIG. 4 will now be explained in detail with reference to FIGS. 7 and 8. During normal circuit operation, resistor Rgate 512 in series with resistor Resd 510 couples terminal 508 to Vss terminal 350. Thus, gate-coupled transistor 506 and pump transistor 510 remain off. During an ESD event, however, all sections of the gate-coupled transistor 506 preferably turn on and conduct ESD stress current between bond pad 500 and Vss terminal 350, thereby protecting the I/O circuit. Uniform turn on of all sections of the gate-coupled transistor 506 is accomplished by bootstrap capacitor 504 coupling an initial fraction of the ESD stress voltage to the common gate terminal 508. This coupling by capacitor Cboot increases the gate-to-source voltage of the gate-coupled transistor 506 to a voltage Vpk (FIG. 7). This voltage Vpk is greater than the transistor threshold Vt and less than a voltage Vch to complete formation of an MOS channel. In a region near this voltage Vpk, a peak substrate current Ipk is injected into the bulk at terminal 518. Pump transistor 510 also begins MOS conduction in response to the voltage Vpk at the common gate terminal 508. The resulting pump transistor current Ip flows along lead 516 to increase the local bulk voltage at point D. Gate-to-bulk current IR1 through resistor R1 also injects current into the bulk at point D. This injected substrate current in the bulk serves to forward bias a parasitic NPN transistor (not shown) formed by the drain, bulk and source of the gate-coupled transistor. In response to this injected current and the increasing ESD stress voltage at bond pad 500, the drain-to-source voltage of the gate-coupled transistor increases to a voltage Vt1 and snaps back to a voltage Vsb (FIG. 8).

If jumper J 304 is open, current through the gate-coupled transistor 506 develops a voltage across resistor Resd at point C that may prevent a forward bias condition of the parasitic NPN transistor. Jumper J 304 of the present invention, however, is advantageously closed during ESD stress so that a total resistance between point E and Vss terminal 350 is a parallel combination of resistor RVss 328 and resistor Resd 310. This relatively lower resistance keeps the source of the gate-coupled transistor 506 at a relatively low voltage to facilitate the forward bias condition.

Although the invention has been described in detail with reference to its preferred embodiments, it is to be understood that this description is by way of example only and is not to be construed in a limiting sense. For example, jumper J may be formed from a metal lead within some or all of the types of standard cells as previously described. In another embodiment, jumper J may be formed as a high current switch such as a bipolar transistor or MOS transistor and activated by a bootstrap capacitor. In yet another embodiment, jumper J may be formed as a lateral PN diode, thereby isolating the separate Vss leads during normal circuit operation but permitting them to conduct current in parallel during ESD stress. Various combinations of resistors and capacitors of the previous embodiments may be combined to provide the advantages of the present invention as will be appreciated by one of ordinary skill in the art having access to the instant specification. Furthermore, the inventive concept of the present invention may be advantageously extended to many parallel transistors in a semiconductor body without current hogging. Finally, advantages of the present invention may be realized by any voltage division of high voltage signals that reduce a maximum electric field across gate dielectric regions.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A semiconductor device, comprising:

a common supply voltage terminal;

a plurality of standard cells, each standard cell having a plurality of leads connected to the common supply terminal; and a plurality of connecting leads, each connecting lead corresponding to a respective standard cell, each connecting lead coupled between at least two leads of the plurality of leads.

2. A semiconductor device as in claim 1, wherein the common supply voltage terminal is a Vss bond pad and wherein the plurality of leads comprises Vss leads.

3. A semiconductor device as in claim 1, further comprising a plurality of bond pads connected to respective leads of the plurality of leads, wherein the common supply voltage terminal is an external pin connected to the plurality of bond pads.

4. A semiconductor device as in claim 1, wherein the plurality of connecting leads is formed from a first conducting layer and wherein the plurality of leads is formed from a second conducting layer displaced vertically from the first conducting layer.

5. A semiconductor device as in claim 1, wherein said each standard cell further comprises:

a bond pad;

at least one of an input circuit, an output circuit, and an input/output circuit coupled to the bond pad; and a protection circuit coupled to the bond pad.

6. A semiconductor circuit as in claim 5, wherein one of the at least two leads is connected to said at least one of an input circuit, an output circuit, and an input/output circuit, and wherein another of the at least two leads is connected to the protection circuit.

7. A semiconductor circuit as in claim 5, wherein the protection circuit further comprises:

a first transistor having a current path coupled between the bond pad and one of the plurality of leads and having a control gate and a bulk terminal; and a capacitor coupled between the bond pad and the control gate.

8. A semiconductor circuit as in claim 7, wherein the protection circuit further comprises:

a substrate terminal coupled to the bulk terminal of the first transistor; and a second transistor having a current path coupled between the bond pad and the substrate terminal and having a control gate coupled to the capacitor.

9. A semiconductor circuit as in claim 7, wherein the protection circuit further comprises:

a substrate terminal coupled to the bulk terminal of the first transistor; and a second transistor having a current path coupled between the bond pad and the substrate terminal and having a control gate coupled to the capacitor.

10. A bus structure, comprising:

a common terminal;

a first lead connected to the common terminal and to a plurality of protection circuits;

a second lead connected to the common terminal and substantially parallel to the first lead, the second lead connected to a plurality of I/O circuits; and a plurality of connecting leads connected between the first lead and the second lead.

11. A bus structure as in claim 10, wherein the common terminal is a supply voltage bond pad and wherein the plurality of leads comprises supply voltage leads.

12. A bus structure as in claim 10, further comprising a first bond pad connected to the first lead and a second bond pad connected to the second lead, wherein the common terminal is an external pin connected to the first and second bond pads.

13. A bus structure as in claim 10, wherein the plurality of connecting leads is formed from a first conducting layer and wherein the first and second leads are formed from a second conducting layer displaced vertically from the first conducting layer.

14. A bus structure circuit as in claim 13, wherein each protection circuit of the plurality of protection circuits comprises:

a bond pad;

a first transistor having a current path coupled between the bond pad and the first lead and having a control gate and a bulk terminal; and a capacitor coupled between the bond pad and the control gate.

15. A bus structure as in claim 14, wherein said each protection circuit further comprises:

a substrate terminal coupled to a bulk terminal of the first transistor; and a second transistor having a current path coupled between the bond pad and the substrate terminal and having a control gate coupled to the capacitor.

* * * * *